United States Patent [19]
Gillingham et al.

[11] Patent Number: 5,854,763
[45] Date of Patent: Dec. 29, 1998

[54] INTEGRATED CIRCUIT WITH NON-BINARY DECODING AND DATA ACCESS

[75] Inventors: Peter B. Gillingham; John Wu, both of Kanata, Canada

[73] Assignee: Mosaid Technologies Inc., Kanata, Canada

[21] Appl. No.: 792,501

[22] Filed: Jan. 31, 1997

[51] Int. Cl.$^6$ .................................................. G11C 13/00
[52] U.S. Cl. .................. 365/189.04; 365/189.01
[58] Field of Search .................... 365/189.01, 189.04, 365/230.01

[56] References Cited

U.S. PATENT DOCUMENTS

| | | |
|---|---|---|
| 5,093,805 | 3/1992 | Singh . |
| 5,315,558 | 5/1994 | Hag . |
| 5,349,552 | 9/1994 | Zampagliane . |
| 5,522,059 | 5/1996 | Marushima et al. ............... 365/189.04 |
| 5,541,850 | 7/1996 | Vander Zanden . |

*Primary Examiner*—Terrell W. Fears
*Attorney, Agent, or Firm*—Kevin Pillay; Santosh K. Chari; John R. S. Orange

[57] ABSTRACT

This invention describes an addressing and data access method and apparatus which can make use of maximum sized, binary configured blocks of memory or macro cells. The binary sized blocks of memory may be used to implement a non-binary sized overall memory circuit. The apparatus as described makes efficient use of silicon area by combining an optimized number of memory blocks or macro cells having at least two data port per macro cell to implement a non-binary sized memory circuit.

13 Claims, 6 Drawing Sheets

INTEGRATED CIRCUIT WITH NON-BINARY DECODING AND DATA ACCESS

This invention relates to an addressing and data access scheme for integrated circuits and more particularly to integrated circuit memory devices requiring non-binary configurations.

BACKGROUND FOR THE INVENTION

Integrated circuit memory devices are used extensively in electronic circuit devices. Traditionally, memory devices such a random access memories (RAM's) have been used as separate discrete components. Generally, these memory devices have standard configurations, i.e. standard data bus sizes and memory sizes. With the advent of custom circuit designs, different types of memory devices are now incorporated as part of an overall custom integrated chip (formed on a signal substrate). The incorporation of application specific or embedded memory in applications specific integrated circuits (ASICs) for example is becoming more predominant due to the advantages of providing wide data bandwidth and dedicated and optimized memory architecture based on specific applications, which results in the lowering of overall component count.

Conventional, discrete memory chips include an array of memory cells arranged in rows and columns. Data is written to and read from the memory device via a data I/O port. Specific memory cells are selected as a function of address codes applied to address inputs. Generally, the device incorporates an address decoder which transforms received external address codes into internal address signals that address the requested cells in the array. Thus, a cell located at the intersection of a specific row and column can be selectively accessed. Control inputs are also provided for selecting either a read or write operation to the addressed cells. Generally, data is accessed from these memories as binary multiples of words (8 bits).

As outlined earlier, in terms of layout, ASICs fit between the detailed full custom layouts and the off the shelf pre-designed components. They offer the designer a fast method of tailoring the circuit to the task while retaining most of the fast design turn around time offered by pre-designed parts. There are two main approaches to ASIC implementation, namely a semi-custom gate array approach and a full custom standard cell embedded macro approach. A gate array generally has two or three layers of metalization placed on top of a base array. The base array is generally pre-designed by the array vendor. It consists of the layers required to define the cells and the components within them. The base arrays for various ASICs are similar in their design concept in that the core of most arrays is composed of an array or matrix of logic or basic cells organized in a row/column configuration. Arrays that contain memory place the RAM blocks in the core area, with the rest of the core designated for internal logic cells. Interface (I/O) cells are placed around the perimeter of the array interspersed with power and ground areas. The customization of the array comes from the interconnect of the base array components. The interconnect is both the intraconnect between components within a cell to perform a function, called a macro, and the interconnect between the macros to form the circuit module.

A macro cell may consist of a customized memory cell area plus the address decoding data I/O circuitry and the control circuitry associated with the memory cell area. Thus the macro cell may be treated and used like a unit memory building block for implementing larger memory structures.

A full custom standard cell implementation allows most layers to be changed and generally results in a more efficient memory structure. Compilers are available to automate the design of memory macro cells within certain constraints allowing memories with flexible address depth and data width to be quickly developed.

More recently, Field Programmable Gate Arrays (FPGAs) are used to implement digital logic circuits, but most have little or no chip memory. A single FPGA will soon be large enough to integrate an entire digital system thereon and as most systems are composed of both logic and memory FPGAs with significant memory capacity will soon be required. A key element of such memory is its ability to accommodate various numbers and shapes of memories in response to widely varying memory requirements for target applications. A memory with such a capability is called a Field Configurable Memory (FCM) and is described in a paper entitled "An SRAM-Programmable Field Configurable Memory" by Tony Ngai, et. al. The configurability of the memory is achieved by a routing structure to connect several basic memory blocks to form a single logical memory.

Discrete memory chips are normally available with address space and data I/O width determined by a power of two, i.e. M words×N bits, where M is equal to $2^i$ and N is equal to $2^j$, i and j integers. Binary addressing schemes favour memories in which the number of addressable cells is a power of two. For a rectangular array of cells this requires that both the number of cell rows and the number of cell columns are a power of two. Thus a 64 k-bit ($2^{16}$) memory can have 256 ($2^8$) cell rows and 256 cell columns. However, a 512×276 memory is non-standard. With application specific or embedded memory becoming more predominant, the requirements for memory which does not directly map onto readily available binary sized memories, is becoming more common. In the context of this application, the memory arrays referred to here as "non-binary" sized have either the number of rows or columns, or both non-divisible by a power of two.

An example of an embedded memory requirement is 12 Mb (mega-bit) of memory to be accessed by a 128-bit wide data bus. Such a requirement can be implemented in a number of configurations, for example 1×12 Mb blocks with 128 bits accessed in parallel; 2×6 Mb blocks with 64 bits accessed per block; 4×3 Mb blocks with 32 bits accessed per block; and 8×1.5 Mb blocks with 16 bits accessed per block. It should be noted that in each of the preceding cases, the memory block is not a binary power sized block such as 1 Mb, 2 Mb, 4 Mb, 16 Mb, but that the number of data I/O ports is a binary size instead.

In the process of designing custom embedded memories, tools such as a software compiler is often used to create custom configurations. A compiler is able to implement memory configurations into the circuit layout design up to a certain maximum size determined by physical performance constraints of the die. These constraints include data bus width, bit line and word line length.

A maximum size block for a given die is the most efficient in terms of bit density because address, data I/O circuits and control circuits do not scale with memory capacity and occupy a fixed overhead in the material. In addition, decoders and data I/O circuits must be designed to accommodate the largest sized block and either do not scale at all or scale partially as the array size is reduced.

The current practice in ASIC design having embedded memory is to use compilers at the memory layout and organization stage of the design process to systematize blocks of any arbitrary size. Using such a compiler at the design stage greatly reduces the time taken to complete the design since manual intervention is not needed.

As an example, consider a DRAM 1 Mb memory block consisting of M=512 rows and N=2,048 columns. A compiler can select a subsection of the 1 Mb block which may no longer have binary sized dimensions and remove the extra cells from the layout. Thus removed area may have dimensions mM×nN, where 0<M<1 and 0<N<1.

$$\text{The overall efficiency } \epsilon \text{ may be expressed as } \epsilon = \frac{M \times N}{\text{(total area macro)}} \quad (1)$$

Thus by equation (1), the compiler reduced block has a lower efficiency then the original binary size block. Therefore, it is desirable to implement a memory block of maximum size and preferably of a binary dimensions, limited only by a maximum performance requirements depends more on data ports as opposed to cell type in order to make best use of the overall chip area.

Furthermore, larger memory arrays, whether compiled or not are typically assembled from a number of maximum sized unit blocks or macro cells to overcome physical limitations on performance. These limitations are generally caused by undesirable capacitive and resistive effects due to long line signal interconnections. For example and M×N block can be repeated to form a memory array of size kM by lN where k and l are integers; 3M×N, M×2N, 2M×3N. This approach runs into difficulties however when an array size such a 1.5M×2N is required. Since if a 2M×2N array is used along with a compiler to remove the unwanted 0.5M×2N memory area, the efficiency of the array will be degraded, because the 1.5M×2N array requires the same amount of overhead as the 2M×2N array. For example, U.S. Pat. No. 5,315,558 describes a method of implementing an integrated circuit with a non-binary array configuration. A non-binary sized array is constructed from binary sized memory blocks where some blocks are used for redundancy. The implementation disclosed in this patent is however, directed to discrete memory devices and is generally not easily applicable to embedded memory devices.

A need therefore arises for an addressing and data access system which can make use of maximum sized and preferably, binary blocks to implement a non-binary sized overall memory system requirement.

SUMMARY OF THE INVENTION

This invention seeks to provide an addressing and data access method and apparatus which can make use of maximum sized, binary configured blocks of memory. The binary power configured blocks of memory may be used to implement a non-binary sized overall memory circuit.

In accordance with this invention there is provided a memory configuration, address decoding and data access method and apparatus which makes efficient use of substrate area by combining an optimal number of binary sized memory blocks or macro cells having two or more data ports per macro cell to implement a non-binary sized memory circuit. An embodiment of the invention provides for a macro cell comprising:

(a) an array of memory cells having M rows by N columns;

(b) a plurality of data port means, selectively operable for communication between said memory cells and an external data bus;

(c) address input means for receiving address codes from an external address; and (d) address decoding means for decoding each of said address codes so that each address code selects a respective set of said cells for communication with said external data bus via said data port means.

BRIEF DESCRIPTION OF THE DRAWINGS

These and other advantages of the present invention become more apparent from the following discussion of preferred embodiments of the invention which are described by way of example only and with reference to the accompanying drawings in which like elements have been assigned like reference numerals and wherein.

DETAILED DESCRIPTION OF THE PREFERRED EMBODIMENTS

Figure 1A:
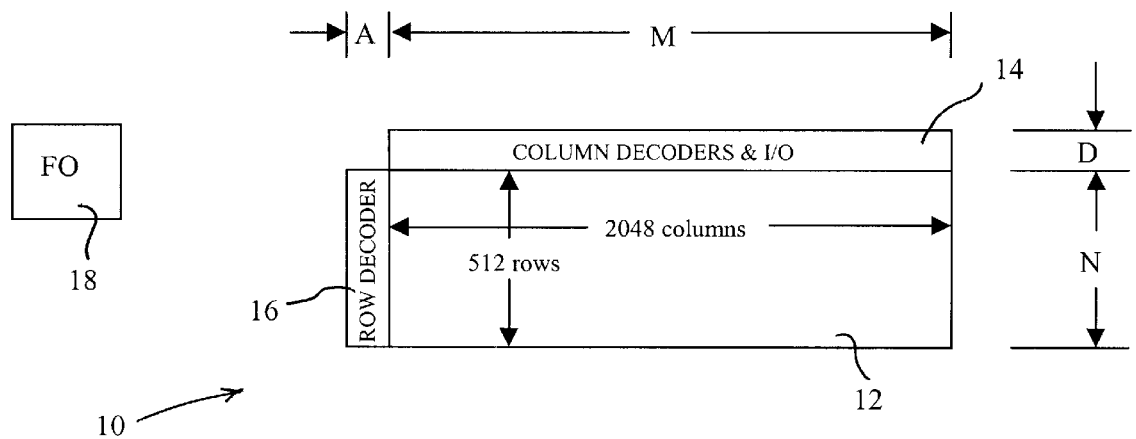
FIG. 1a is a schematic outline of a typical DRAM memory block as implemented in the prior art.
Figure 1B:
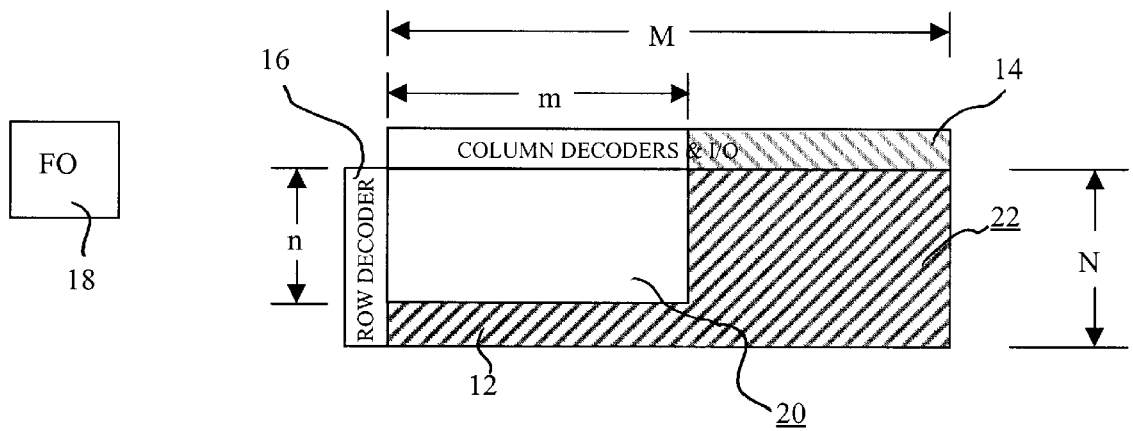
FIG 1b is a schematic outline of a typical compiler reduced block as implemented in the prior art.

Referring to FIG. 1a, a standard 1 Mb DRAM memory block is indicated generally by numeral 10. The block includes a 1 Mb memory array 12 of 2,048 columns×512 rows (M×N). Associated with the memory array 12 is an area 14 allocated to column decoders and I/O circuitry and an area allocated to row decoders 16. In addition, an area 18 of the substrate is occupied by control circuit buffers and the like which contribute a fixed overhead associated with each memory block 12. The fixed overhead 18 does not scale with memory array 12 size and can be considered constant for different memory size blocks. Should a smaller capacity memory block be required, conceptually a compiler selects a subsection 20 of the 1 Mb block 12 of FIG. 1a and removes extra cells 22 from the 1 Mb block 12 as indicated in FIG. 1b. The remaining area 20 may no longer have binary sized dimensions. Furthermore, in some cases the column/row decoders are also removed. Thus, as shown in FIG. 1b, the removed area has dimensions m and n, where m is less than M and n is less than N. The ratio of the remaining memory cell area 20 to the total area of the memory block including column decoders, fixed overhead and row decoders provides an indication of the efficiency of the substrate utilization for a given memory configuration. Clearly, the efficiency of a memory block in FIG. 1b is less than that of the memory block in FIG. 1a.

Larger memory arrays are assembled from a number of maximum sized unit blocks 10 similar to that shown in FIG.

Figure 2:
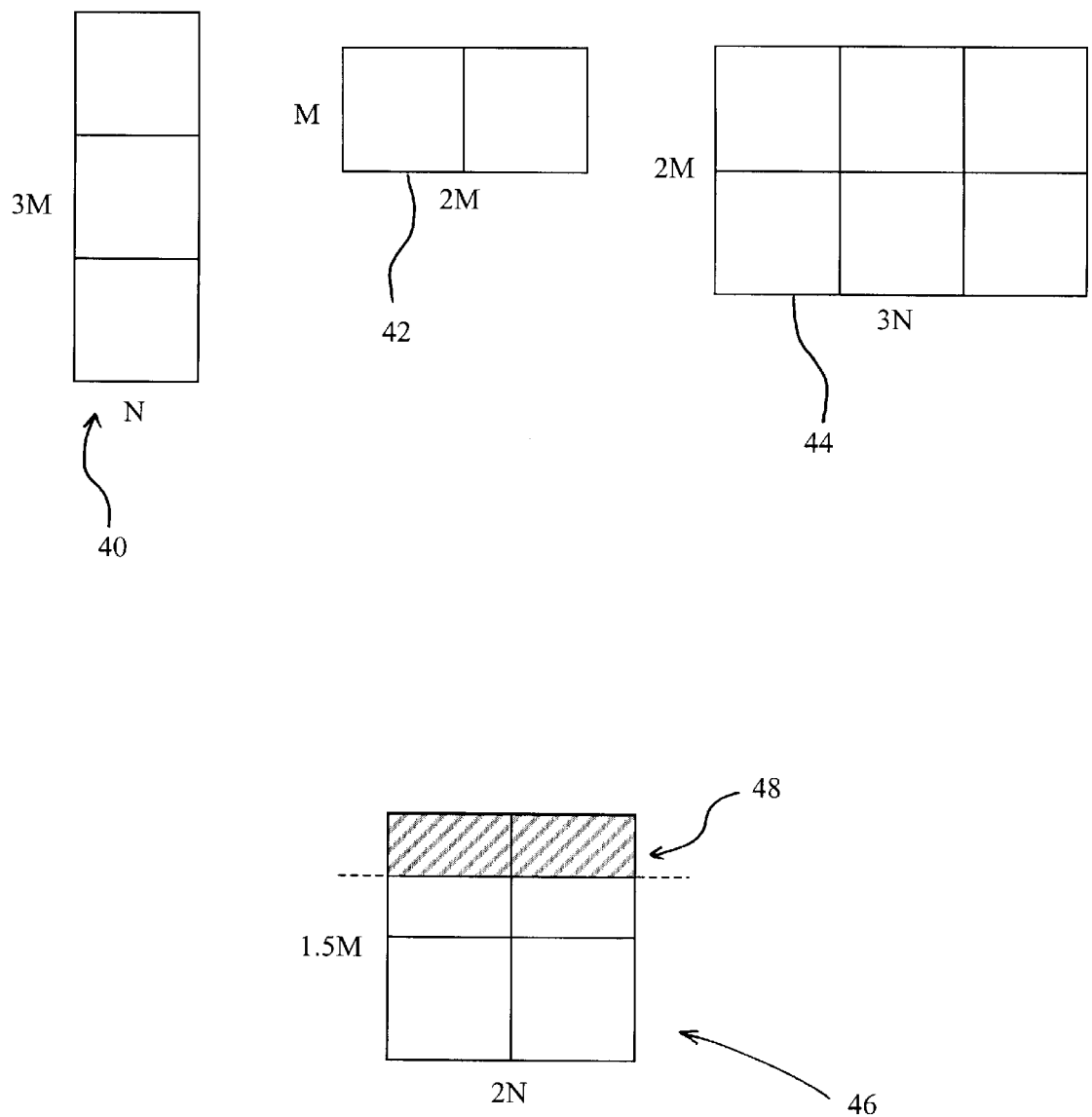
FIG. 2 shows schematic outlines of various combinations of memory blocks.

1a. For example the M×N block of FIG. 1a can be repeated to form a memory array of size kM×lN where k and l are integers. Thus blocks of 3M×N, 40; M×2N, 42; 2M×3N, 44 may be easily constructed as shown in FIG. 2. A difficulty however arises when an array size such a 1.5M×2N is required as shown by numeral 46 in FIG. 2. The original 2M×2N array 46 is utilized with the unwanted 0.5M×2N memory area 48 being removed. The utilization efficiency of the substrate will be degraded since the 1.5M×2N array 46 requires the same amount of overhead as the 2M×2N array.

Figure 3:
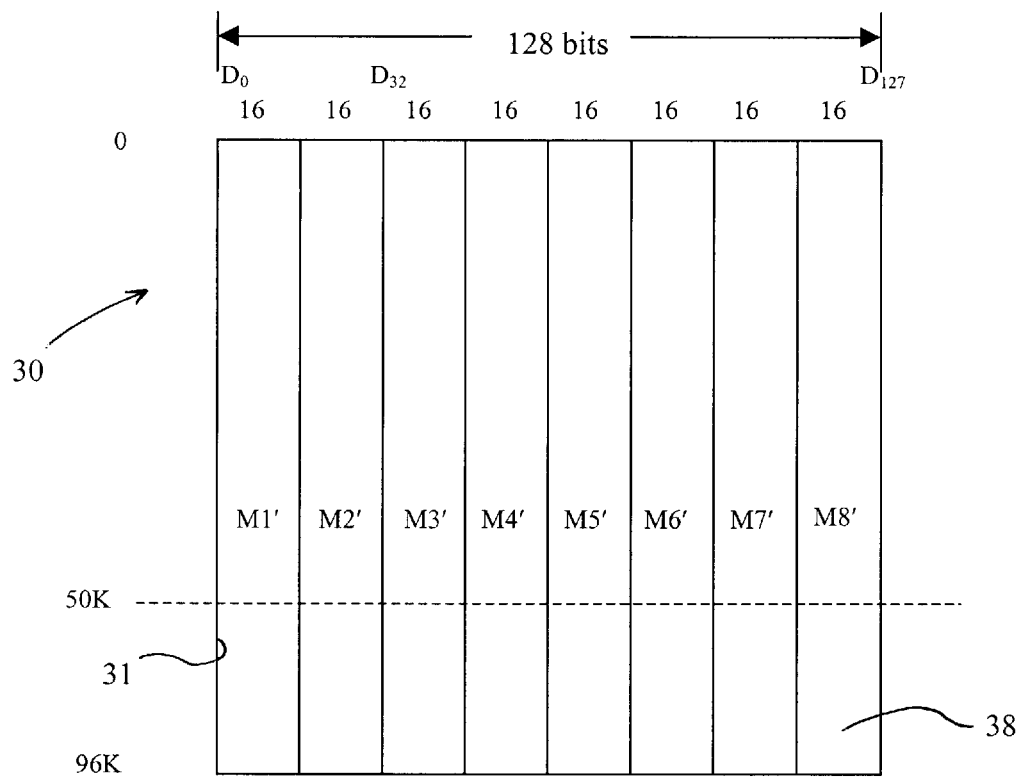
FIG. 3 is a schematic of the logical layout of memory blocks according to the prior art.

Referring to FIG. 3, a logical memory map for implementing a 12 Mb embedded memory device having a 128 bit wide data port D0–D127, is shown general by numeral 30. For example, if 2 Mb memory blocks are available having 16 bit wide data port, then the 12 Mb memory may be constructed by utilizing eight 2 Mb blocks each reduced by 0.5 Mb. Since, the number of data I/O ports must be a binary powered of the 128 bit data bus, the largest memory block possible within a 2 Mb block is 1.5 Mb. Thus according to the prior art, it would be necessary to reduce the 2 Mb blocks to 1.5 Mb arranged in eight blocks to achieve the 12 Mb memory. However, the 1.5 Mb blocks are not optimally configured as binary sized blocks, and thus suffer from the inefficiencies described earlier.

Figure 5A:
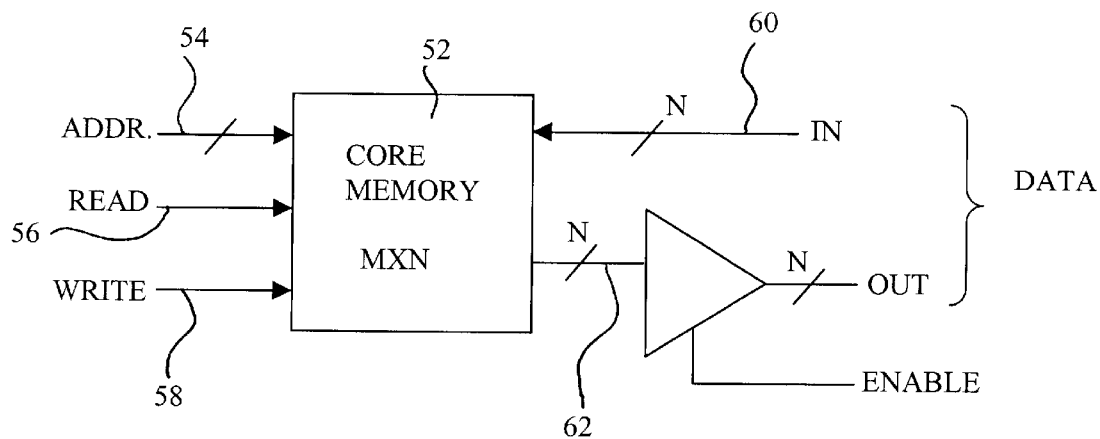
FIG. 5a is a schematic circuit diagram of a memory block having a single I/O data port.

As described earlier, each of the memory blocks or macro cells 31 to 38 as illustrated in FIG. 3 include a core memory 52, address lines 54, read lines 56, write lines 58, n bit data input 60 and n bit data output circuitry 62, as shown in FIG. 5a. Thus returning to the previously mentioned example of implementing a 12 Mb of memory in a 128 bit wide system using the macro cell of FIG. 5a requires that the n bit output 62 of the macro cell is dedicated to a specific position in the 128 bit wide data bus. For example, the data I/O ports of macro cell 2 in FIG. 3, would correspond to data I/O line D16–D31.

It must be noted, that the dimensions of the 1.5 Mb block are 16×96 k-bits, where, 1 k=1024($2^{10}$) bits. In the prior art embodiment of FIG. 3, the 1.5 Mb macro cells address maps directly onto the external global address of the memory. If, for example, an address at location 50 k is requested, a row at the 50 k location of each macro cell is enabled to output 16 bits per block to obtain the total 128 bits. This one-to-one mapping between the global address and the macro cell internal address is simple but relies on the use of inefficiently sized blocks. Incidentally in this arrangement, the global address need only range from A0 to A16 which gives a total address space of 128 k, which is the smallest binary power address space containing the 96 k address space required for the memory blocks.

Figure 5B:
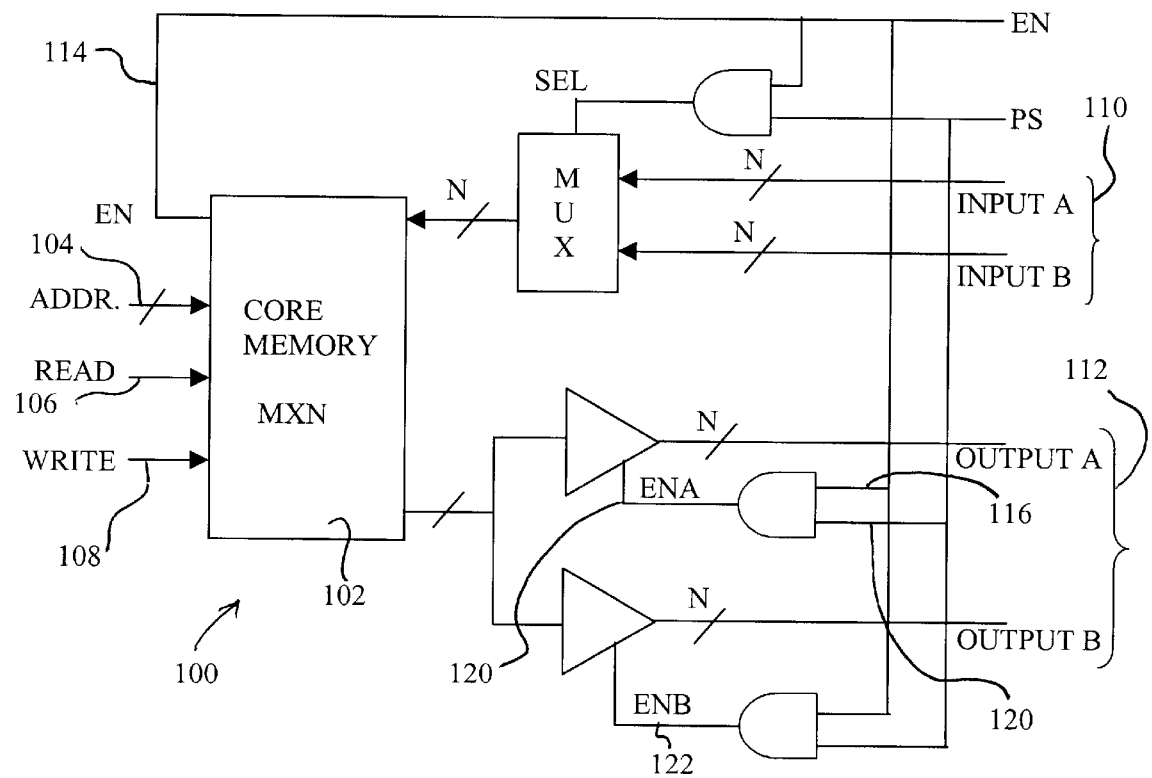
FIG. 5b is a schematic electrical circuit diagram showing a memory macro cell having two I/O ports.

Referring to FIG. 5b, a macro cell according to the present invention is shown generally by numeral 100. The macro cell is similar to the macro cell of FIG. 5a in that it has a core memory 102 but which a standard binary sized array of cells M×N, wherein M=$2^i$ and N=$2^j$. It may also be noted that although a binary sized array is described in this example, non-binary sized array may equally well be used. Also in addition to the standard address lines 104, read lines 106, and write lines 108, the macro cell includes dual input (A,B) and dual output ports (A,B) 110 and 112, respectively. The macro cell 100 is also provided with a enable signal line 114 for selectively enabling the macro cell 100. By providing appropriate address decoding and enabling of I/O ports A and B, data may be written into or read from selected areas of the core memory 102. In FIG. 5(b) the macro 100 is provided with a port select control P5, 130 and a port enable EN, 132 control.

Figure 4A:
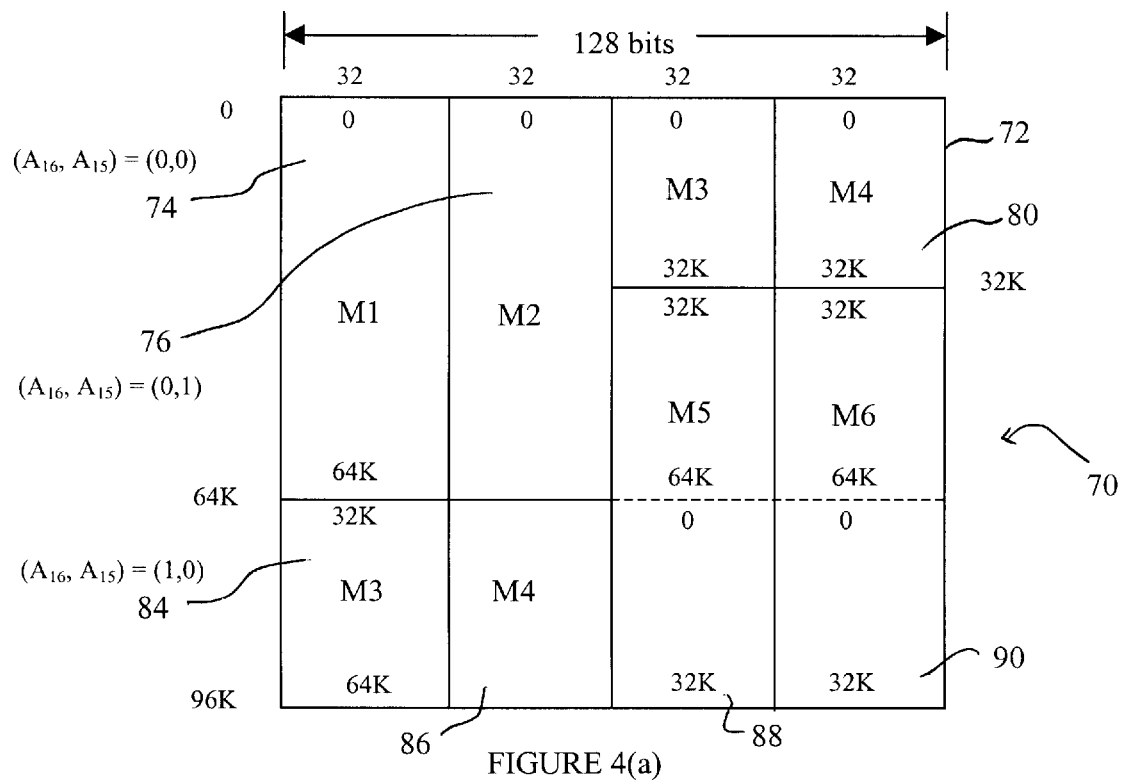
FIG. 4a is a schematic showing the logical arrangement of memory blocks according to the present invention.

Utilizing macro cell 100 of FIG. 5b, the 12 Mb memory of the previous example may be implemented according to the present invention. The 12 Mb, 128 bit wide memory requirement can be arranged according to an embodiment of the present invention using six 2 Mb memory macro cells, wherein each macro cell has two selectively activated I/O ports 110 and 112, respectively. A logical memory map 70 using six of the 2 Mb macro cell numbered M1, M2, M3, M4, M5 and M6 is shown in FIG. 4(a). The 12 Mb memory requirement may be logically represented as an array 128 bits×96 k bits, indicated by block 72. As the blocks only have an address depth of 64 k bits, the upper 64 k bits of address space is occupied by memory block M1 and M2, 74 and 76, while the lower 32 k to 96 k address space is thus made up of the lower half of memory block M3 and M4, 84 and 86, respectively. The upper half of memory block M3 and M4, 73 and 72 occupy the address space from 0 k to 32 k. The remaining area below the upper sections of memory blocks, M3 and M4 are occupied by memory blocks M5 and M6, 88 and 90. Memory blocks M1 and M2, 74 and 76 thus have their data I/O corresponding to the D0 to D64 bits while the upper half of memory blocks M3 and M4, 78 and 80 have their data I/O corresponding to the remaining bits D64 to D127.

Figure 4B:
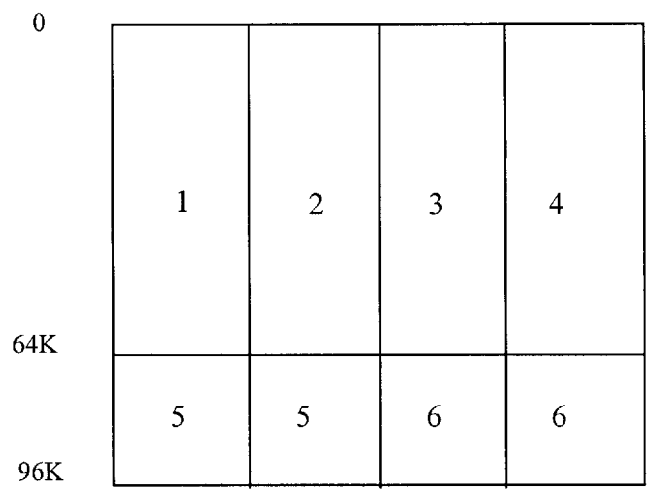
FIG. 4b is a schematic showing another logical arrangement of memory blocks.
Figure 4C:
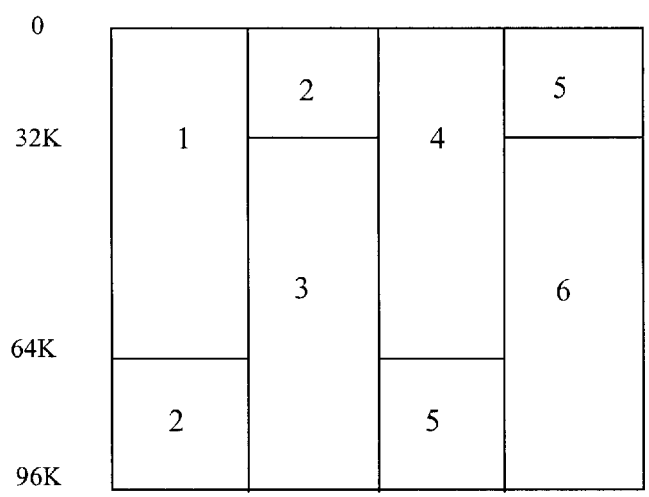
FIG. 4c is a schematic showing a further logical arrangement of memory blocks.

To physically implement this logical memory configuration the global or external address space A0–A16 must be mapped to the internal macro address space. It must be noted that the logical memory map 70 is constructed using macros M1 through M6 and arranged as shown in order to not to have any horizontal duplication of bits accessed for a given global address, since only 32 bits are accessible per macro cell. For example the arrangement for FIG. 4b would not work due to the overlap of address space for each of the sections of macros M5 and M6. Whereas the arrangement shown in FIG. 4c would work as segments of the macro cells do not overlap in a given memory space.

As indicated earlier, the address lines A0 to A16 map onto an address space of 1 to 128 k. In the embodiment shown in FIG. 4a, the address A0 to A15 are capable of addressing cells in the range of 0 to 64 k, while address line A16 is capable of addressing macro cells in the range of 64 k to 96 k. The external memory address of A0 to A16 may thus be re-mapped to the internal address space in order to select the appropriate I/O ports of appropriate macro cells utilizing the top two most significant address bits A15 and A16 as follows:

TABLE I

| global address MSB's A16, A15 | macro 1 PS | macro 2 PS | macro 3 PS | macro 4 PS | macro 5 PS | macro 6 PS |
| --- | --- | --- | --- | --- | --- | --- |
| 00 | [port 0] | [port 0] | port 0 | port 0 | X | X |
| 01 | [port 0] | [port 0] | X | X | [port 1] | [port 1] |
| 10 | X | X | port 1 | port 1 | [port 1] | [port 1] |

(Note:
[port 0 or 1] = "hard-wired" and combined with the enable signal to value "0" or "1".
X = no port enabled).

From table I, it may be seen that when A15 to A16 equal zero, port 0 of macro M1 and macro M2 is enabled and port 0 of macro M3 and M4 are selectively enabled. When address lines A15 and A16 are equal to 0 and 1, marco M1 and macro M2 are enabled as previously, while port 1 of macro M5 and M6 is enabled. Finally, when A16 is equaled to 1 and A15 is equal to 0, port 1 of macro M3, M4, M5 and M6 are enabled. Since macro cells 1 and 2 only use port 0, port 0 is effectively "hardwired" as a "0". Similarly, macros 5 and 6 have port 1 "hardwired" to the P5 input of the macro cell as a "1." Macros M3 and M4, however, have to be mapped according to the A15 and A16 addresses as shown in the above table. In the case of a X appearing in the table both of the ports are disabled.

In addition, due to the direct mapping of the macros M1, M2, M5 and M6, i.e. these macros cells are not logically separated across an address space like macro cells M3 and M4, the internal A15 addresses for these macros cells is connected as follows:

TABLE II

| Global address MSB's A16, A15 | macro 1 A15 | macro 2 A15 | macro 3 A15 | macro 4 A15 | macro 5 A15 | macro 6 A15 |
|---|---|---|---|---|---|---|
| 00 | A15 = 0 | A15 = 0 | A15 = 0 | A15 = 0 | X | X |
| 01 | A15 = 1 | A15 = 1 | X | X | A15 = 1 | A15 = 1 |
| 10 | X | X | A15 = 1 | A15 = 1 | A15 = 0 | A15 = 0 |

(X = "don't care" state.)

Effectively, Table II shows that for macro cell M1, M2, M5 and M6, the external global address A15 is used as the internal macro address A15 since there is direct mapping between the two addresses. For macro cells M3 and M4 the external global address A16 is used as the internal macro address A15.

Figure 6:
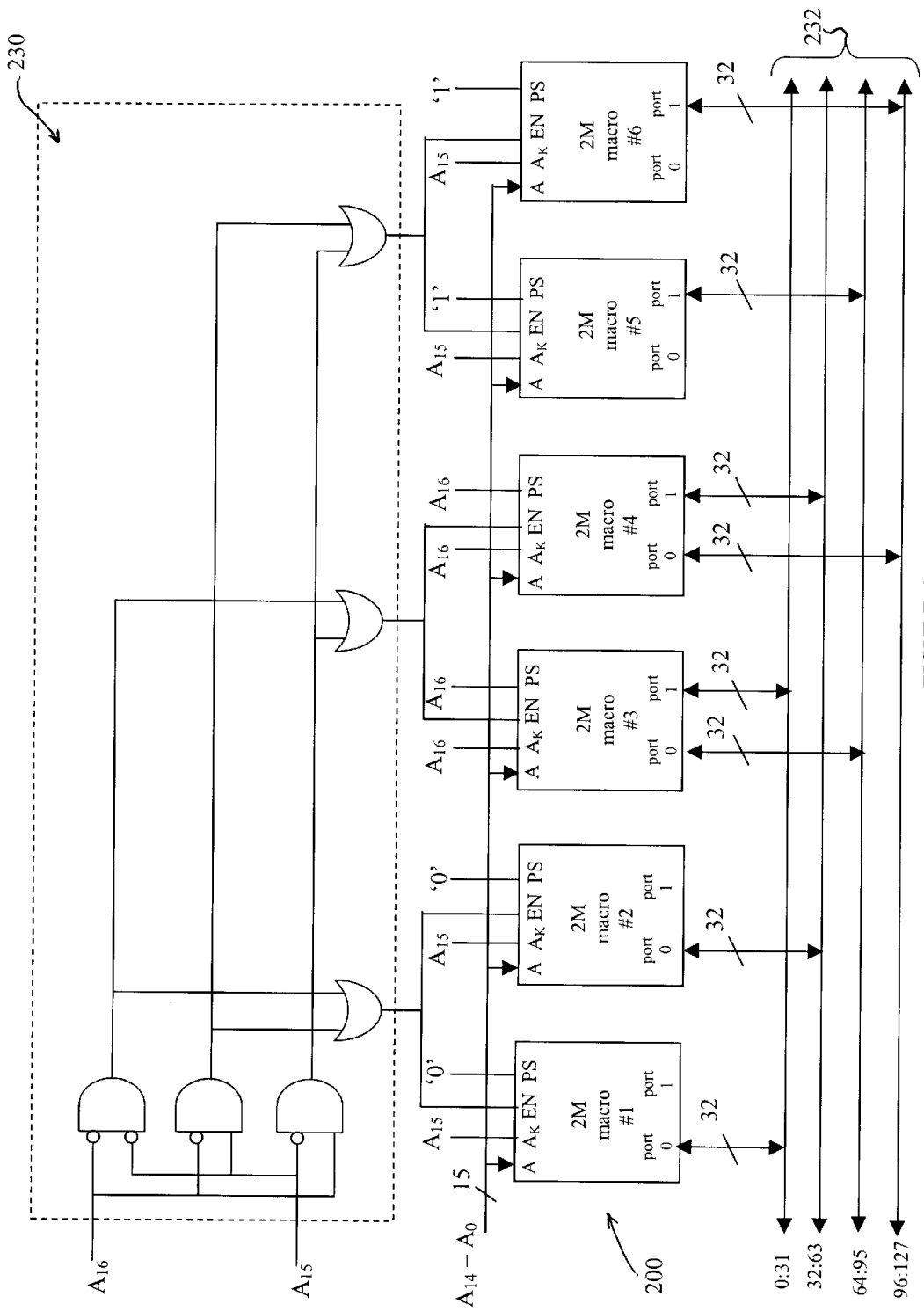
FIG. 6 is a schematic circuit diagram implementing a memory block utilizing the macro cells shown in FIG. 5b.

Referring to FIG. 6, an implementation of the logical memory map 70 of FIG. 4a is indicated generally by numeral 200. The macro cells M1 to M6 of FIG. 6 are internally configured according to macro cell 100 of FIG. 5b. As may be seen with reference to FIG. 6, global external address lines A0 to A14 are connected directly to the corresponding address lines of each of the macro cells M1 to M6. External address global address line A15 is connected directly to address line A15 of macro cell M1, M2 M5 and M6 while address A16 is connected directly to the address line A16 of macro M3 and M4. Each of the macro cells has an enable and port select line 116 and 120, respectively as shown in FIG. 5(b). In order to select the appropriate output port, the enable and port select line P5 are ANDed to the port 0 enable input signal line 120 and the enable and the inverted port select line are ANDed to the port 1 enable signal line 122. The selection signal for the port select line is generated from the truth Table I shown above. Each of the macro cells is enabled via the logic gates derived from external global address line signals A15 and A16 indicated by numeral 230. The data I/O lines 232 connect to the output ports of the macro cells as indicated by the truth Table I above.

Thus it may be seen that the logical memory map utilizing the macro cells of the subject invention may be implemented in various forms. Although the embodiments are shown with two I/O ports per macro cell, other multiples of I/O ports may also be used. Furthermore, although the above embodiments have been discussed with the reference to ASIC and DRAMs, other types of embedded memories may also be used for example the above technique may equally be applied to HDRAM, SDRAM, SRAM, EPROM, ROM and other nonvolatile memories as well as field programmable gate arrays (FPGAs) or similar devices including a configurable memory blocks. These and other modifications to and variations upon the preferred embodiments are provided for by the present invention the scope of which is limited only by the following claims.

We claim:

1. A macro cell for implementing a memory device having an n-bit external data bus and a m-bit global address bus, said macro cell comprising:

(a) an array of memory cells having M rows by N columns, which array consisting of a plurality of memory segments each in communication with a common internal data bus;
   (b) address input means for receiving decoded address codes, said codes for selecting a respective set of cells in one of said segments for communication on said internal data bus; and
   (c) a plurality of data ports corresponding in number to said segments for communicating data between said internal data bus and one of a plurality of groups of bits of said external data bus, and each said data port being activated by a port select signal generated in response to cells in its corresponding memory segment being selected, whereby said memory segments may be logically remapped in a global address space.

2. A macro cell as defined in claim 1, said data port means being an integral power of two in number.

3. A macro cell as defined in claim 2, said data port means being two in number.

4. A macro cell as defined in claim 1, M and N being an integral power of two.

5. A macro cell as defined in claim 1, including an enable input responsive to an enable input signal for enabling said data ports and said memory array.

6. A macro cell as defined in claim 5, said bits of said external data bus being an integral multiple of said internal data bus.

7. A method of constructing a memory device defining a predetermined memory space of size s bits, said memory device adapted for use with a n-bit data bus, where n is an integral power of two, and an m-bit address bus for accessing said memory space, said method comprising the steps of:

(a) selecting a plurality of macro cells each having an array of memory cells of M rows by N columns, where M and N are integral powers of two and N<n and M<s/n and having at least two N-bit data ports;
   (b) dividing said memory space, logically, into N columns and s/n rows;
   (c) arranging a first number of said macro cells to logically fit entirely within columns of said divided memory space such that said N data bits of said first number of macro cells are aligned with corresponding data bits of respective columns of said memory space, so as to occupy at least M rows per column;
   (d) dividing, logically, a second number of macro cells into at least binary sized s/n—M row segments;
   (e) arranging said segments of said second number of macro cells to logically fit within the remaining memory space of each column divided in step (b), such that segments of a memory cell do not overlap across a given row of said memory space; and
   (f) implementing said memory space in a memory device.

8. A memory device adapted for use with an n-bit data bus and an m-bit address bus, said device comprising:

(a) plurality of macro cells, each said macro cell including:
      i) an array of memory cells having M rows by N columns, which array consisting of a plurality of memory segments each in communication with a common internal data bus;
      ii) address input for receiving decoded address codes, said codes for selecting a respective set of cells in one of said segments for communication on said internal data bus;
      iii) a plurality of data ports corresponding in number to said segments for communicating data between said internal data bus and one of a plurality of groups of bits of said external data bus, and each said data port being activated by a port select signal generated in response to cells in its corresponding memory segment being selected, whereby said memory segments may be logically remapped in a global address space;

(b) address decoding means for decoding a global address and for generating a respective one of said port select signals and said decoded address codes; and (c) means for selectively enabling one or more of said macro cells in response to a global address.

9. A memory device as defined in claim 8, said data port means being an integral power of two in number.

10. A memory device as defined in claim 9, said data port means being two in number.

11. A memory device as defined in claim 8, M and N being an integral power of two.

12. A memory device as defined on claim 8, said device being a field programmable gate array.

13. A memory device as defined in claim 8, said device being an application specific integrated circuit.

* * * * *